United States Patent
You et al.

(10) Patent No.: US 7,333,373 B2
(45) Date of Patent: Feb. 19, 2008

(54) CHARGE PUMP FOR USE IN A SEMICONDUCTOR MEMORY

(75) Inventors: Hyung-Sik You, Gyeonggi-do (KR); Hyun-Seok Lee, Seoul (KR)

(73) Assignee: Samsung Electroncis Co., Ltd., Suwon-si, Gyeonggi-do (KR)

( * ) Notice: Subject to any disclaimer, the term of this patent is extended or adjusted under 35 U.S.C. 154(b) by 50 days.

(21) Appl. No.: 11/210,460

(22) Filed: Aug. 23, 2005

(65) Prior Publication Data

US 2006/0109719 A1    May 25, 2006

(30) Foreign Application Priority Data

Aug. 23, 2004  (KR) ...................... 10-2004-0066380

(51) Int. Cl.
*G11C 7/00*    (2006.01)
(52) U.S. Cl. .................. 365/198; 365/226; 365/189.09
(58) Field of Classification Search ........... 365/189.09, 365/198, 226
See application file for complete search history.

(56) References Cited

U.S. PATENT DOCUMENTS

| | | | | |
|---|---|---|---|---|
| 5,841,725 A | * | 11/1998 | Kang et al. | ................. 365/226 |
| 5,943,226 A | * | 8/1999 | Kim | ........................... 327/537 |
| 5,982,224 A | | 11/1999 | Chung et al. | |
| 6,560,162 B2 | * | 5/2003 | Kwon | ................... 365/230.06 |
| 2004/0027102 A1 | * | 2/2004 | Kim | ........................... 323/265 |

* cited by examiner

*Primary Examiner*—Thong Q. Le
(74) *Attorney, Agent, or Firm*—Marger Johnson & McCollom, P.C.

(57) ABSTRACT

In an embodiment, an improved charge pump circuit is provided to control a threshold voltage increase of a charge transmission transistor during a charge transfer period, and to prevent a latch-up generation during a charge non-transfer period. A charge transmission transistor transmits the voltage of a boosting node to a high voltage generation terminal in response to the voltage of a control node. In a bulk connection switch, during the charge transfer period the high voltage generation terminal is connected to the bulk of the charge transmission transistor and during the charge non-transfer period the bulk is connected to the low voltage, being lower than that of the voltage appearing at the boosting node of the charge transmission transistor or the high voltage generation terminal. Charge transmission efficiency and pumping operation reliability are improved, increasing the reliability of data access operations in a semiconductor memory device, for example.

19 Claims, 6 Drawing Sheets

CHARGE PUMP FOR USE IN A SEMICONDUCTOR MEMORY

CROSS REFERENCE TO RELATED APPLICATIONS

This application claims priority from Korean Patent Application No. 2004-66380, filed on Aug. 23, 2004, the contents of which are hereby incorporated by reference for all purposes.

BACKGROUND OF THE INVENTION

1. Field of the Invention

The present invention relates to a voltage generating circuit for generating a voltage higher than an operating voltage, and more particularly, to a charge pump circuit applied appropriately to a semiconductor memory device.

2. Description of the Related Art

Semiconductor memory devices in recent times tend to have an operating voltage that is lowered to reduce power consumption. But some circuit portions of semiconductor memory, e.g., word line drivers or output drivers, require a high voltage higher than the operating voltage. Thus, charge pump circuits are equipped with most semiconductor memory chips.

Examples of various charge pump circuits are disclosed in U.S. Patent Application Publication No. US2004/0027102 (Kyu-Hong Kim). In this patent application, a charge pump circuit disclosed as the conventional technique is constructed of the plurality of inverters I1, I2, I3, and I4, capacitors C1, C2, and C3, and NMOS transistors N1-N6, as shown in FIG. 1. When signals CON1 and CON2, shown in FIG. 2, are respectively applied to the inverters I1 and I2, and when the voltage at node A is larger than VCC+Vth, the voltage at node B increases to VCC and is then boosted to 2VCC, as in waveform B shown in FIG. 2, by operation of the capacitor C2. Meanwhile, node C has a voltage of VCC when the output voltage of the inverter I3 becomes greater than VCC+Vth, and is then boosted to VCC+VPP, as in waveform C, shown in FIG. 2, by operation of the capacitor C3. NMOS transistor N6 performs the charge sharing operation between node B and a high voltage generation terminal VPP in response to the voltage at node C. In NMOS transistor N6, the bulk (i.e., the substrate) is at a ground voltage and the source is at the high voltage VPP or voltage 2VCC, and the voltage difference between the source and the bulk becomes VPP or 2VCC. Thus the threshold voltage Vth of the NMOS transistor N6 can increase hundreds of times more than when the voltage difference between the source and the substrate is zero.

Meanwhile, the voltage applied to the gate of the NMOS transistor N6 maintains the voltage VPP+VCC, so the charge transmission efficiency between node B and the high voltage generation terminal VPP is lowered. That is, the charge transmission transistor N6 constructed of an NMOS transistor transfers the charge of node B to the high voltage generation terminal VPP in response to the voltage of control node C in the charge pumping operation. Meanwhile, in the charge pump circuit of FIG. 1, the bulk voltage of the charge transmission transistor N6 is fixed to the ground voltage, and in this state the source voltage increases during the boosting operation. Hence, the threshold voltage of the charge transmission transistor N6 increases by the body effect. The charge of boosting node B is difficult to sufficiently transfer to the high voltage generation terminal VPP since the gate voltage of the charge transmission transistor N6 is still fixed even though the threshold voltage becomes large.

The patent application described above discloses an improved charge pump circuit, shown in FIG. 3, to solve the problem of the charge pump circuit of FIG. 1. That is, the circuit of FIG. 3 uniformly maintains the voltage difference between the source and the bulk or substrate of the NMOS transistor N6 shown in FIG. 1 so as not to increase the threshold voltage. FIG. 3 depicts a configuration that includes NMOS transistors N7 and N8, which are added to the configuration of the circuit shown in FIG. 1.

In FIG. 3, the drain of the NMOS transistor N7 is connected to the drain of NMOS transistor N6, the gate of the NMOS transistor N7 is connected to the high voltage generation terminal VPP, and the source of the NMOS transistor N7 is connected to node D. The source of the NMOS transistor N8 is connected to node D, the gate of the NMOS transistor N8 is connected to node B, and the drain of the NMOS transistor N8 is connected to the high voltage generation terminal VPP. Node D is connected to the bulk or substrate of the NMOS transistor N6.

Operation of the charge pump circuit shown in FIG. 3 will now be described, based on the functions of newly added NMOS transistors N7 and N8.

When signals CON1 and CON2 having the ground voltage are applied, nodes A, B, and C are precharged to a voltage 2VCC−Vth, the voltage VCC, and the voltage VCC, respectively, and the voltage of node D becomes VCC. When in this state, the signal CON1 of the power source voltage (VCC) is applied, the voltage of node A becomes VCC−Vth, and the voltage of node B increases to 2VCC. Then the NMOS transistor N7 will be in an on state and the voltage of node D becomes VPP−Vth. When the signal CON2 of power source voltage level is applied, the voltage of node A becomes VCC−Vth and the voltage of node C becomes VCC+VPP. Then the NMOS transistor N6 is turned on and the charge sharing operation is performed between node B and the high voltage generation terminal VPP to increase the voltage level of the high voltage generation terminal VPP. The NMOS transistor N8 is turned on, and the voltage of the high voltage generation terminal VPP is slowly increased. In other words, during the charge sharing operation, the NMOS transistor N8 is turned on to increase the voltage level of the high voltage generation terminal VPP, and then increase the voltage level of node D. That is, in the charge pump circuit of FIG. 3, when the signal CON1 is changed to the power source voltage VCC, the NMOS transistor N7 is turned on to increase the voltage of node D and the bulk of the NMOS transistor N6, and so reduce the voltage difference between the source and the bulk of the NMOS transistor N6. When the signal CON2 is changed to the level of the power source voltage VCC and the voltage of high voltage generation terminal VPP increases, the NMOS transistor N8 is turned on to increase the voltage of node D and the bulk of the NMOS N6 and so reduce the voltage difference between the source and the bulk of the NMOS transistor N6.

In the charge pump circuit of FIG. 3, the bulk (substrate) voltage of the NMOS charge transmission transistor is increased by an increase of source voltage so as not to increase the threshold voltage. Thus the charge transmission efficiency can be increased, but the following problems may be caused.

In FIG. 3, the bulk node D is connected to the node that has a low voltage level among the boosting node B and the high voltage generation node VPP to reduce a body effect, but when the voltage difference between node B and node D, or the voltage difference between node VPP and node D, is not larger than the difference corresponding to the threshold voltage that the NMOS transistor N7 and the NMOS transistor N8 respectively have, the NMOS transistors N7 and N8 are not turned on. In this case, node D will be in a floating state and the charge pumping operation may be uncertain. Thus, the increase of threshold voltage may not be prevented or reduced, degrading the charge transmission efficiency.

Accordingly, the body effect cannot be reduced due to the added transistors, as described aboven, and operation reliability is lowered by the floating state of bulk node.

SUMMARY OF THE INVENTION

An exemplary embodiment of the invention provides the charge pump circuit, which is capable of more efficiently reducing the body effect, compared to a conventional method.

Another exemplary embodiment of the invention provides a charge pump circuit for use in the semiconductor memory device, in which a bulk or substrate of a charge transmission transistor does not float by reducing the body effect. A threshold voltage increase of the charge transmission transistor is substantially reduced to obtain more efficient charge transmission operation. During a charge transfer period a high voltage generation terminal of the charge transmission transistor is connected to the bulk, thus removing the body effect, and during a charge non-transfer period, a latch-up is prevented.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Exemplary embodiments of the invention are more fully described in detail with reference to FIGS. 4 to 6 in which like components having like functions have been provided with like reference symbols and numerals. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 4:
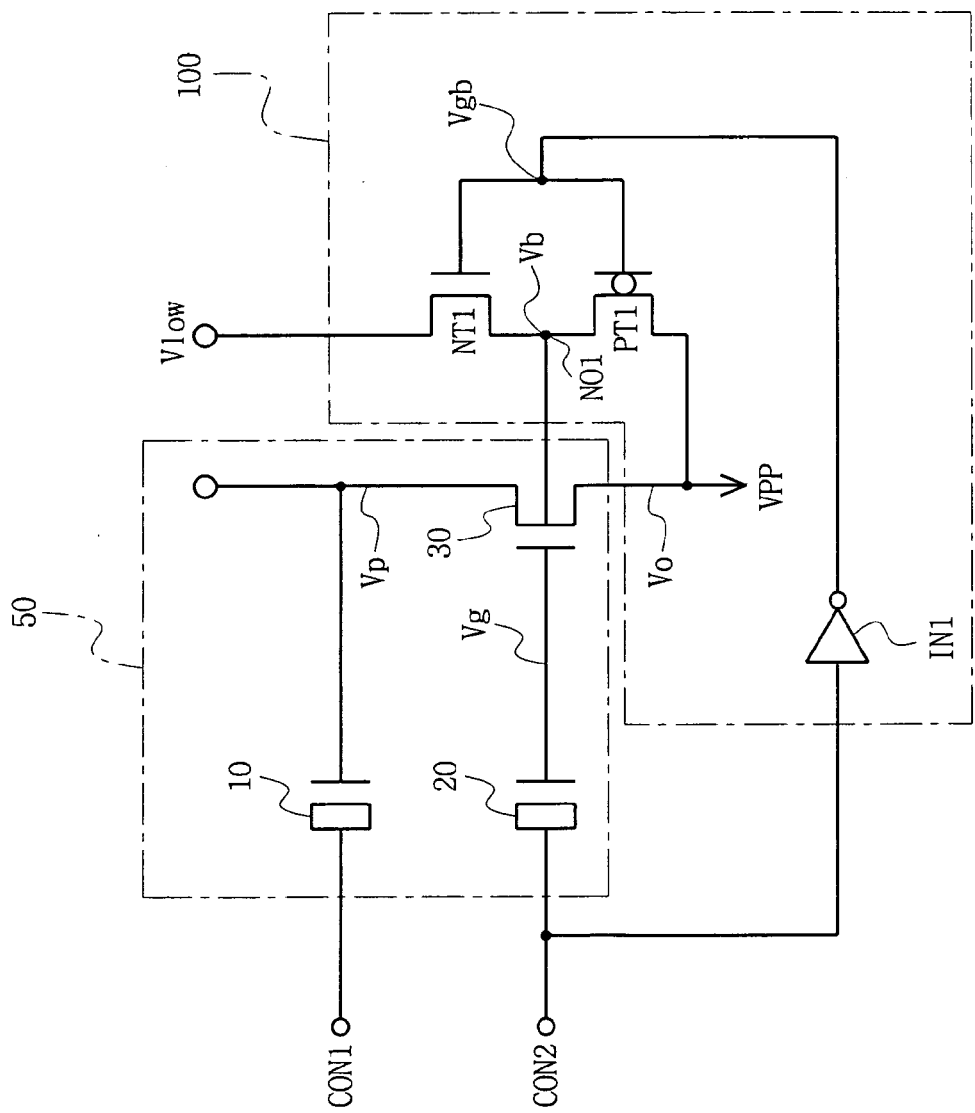
FIG. 4 is a circuit diagram of charge pump circuit according to an exemplary embodiment of the invention.

FIG. 4 is a circuit diagram of a charge pump circuit according to an exemplary embodiment of the invention. Referring to FIG. 4, the charge pump circuit includes a charge pumping portion 50 having a general charge transmission transistor 30 and a bulk connection switch 100. During a charge transfer period a high voltage generation terminal VPP is connected to a bulk Vb of the charge transmission transistor 30, via a PMOS transistor PT1, and during a charge non-transfer period the bulk Vb is connected to a low voltage Vlow, via an NMOS transistor NT1, that has a level lower than the voltage appearing in the boosting node Vp of the charge transmission transistor 30 or the high voltage generation terminal Vo, which is VPP.

The bulk connection switch 100 includes a inverter IN1 for generating a gate input voltage Vgb for which the time span of a low period is shorter than that of a high period, and which has a phase opposite to that of the voltage of the control node. Also included is the NMOS transistor NT1 of which the gate is connected to the gate input voltage, the source is connected to the low voltage Vlow, and the drain is connected to the bulk Vb. Finally, the PMOS transistor PT1 has its gate connected to the gate input voltage Vgb, the drain connected to the bulk Vb, and the source connected to the high voltage generation terminal VPP.

Figure 5:
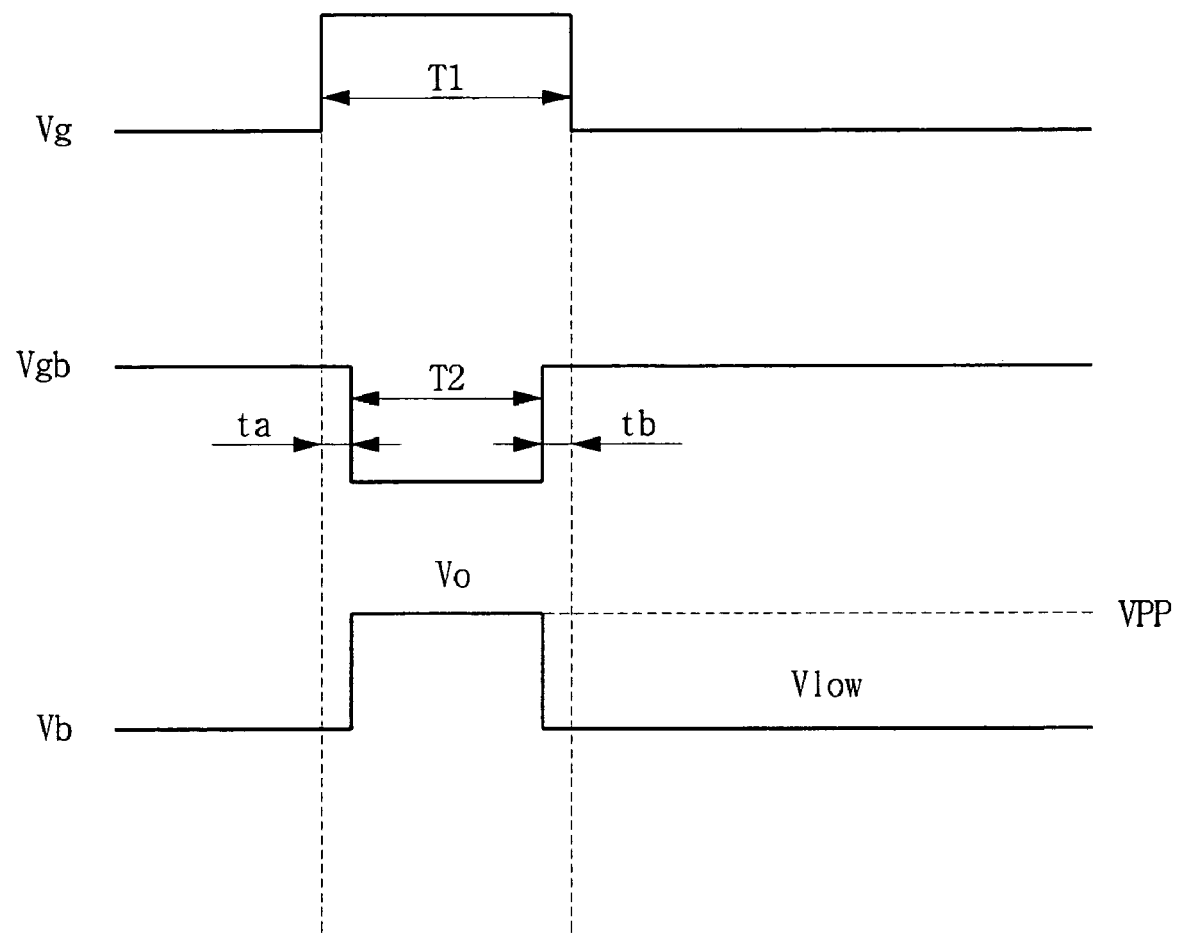
FIG. 5 illustrates signal waveforms appearing in respective nodes of the circuit shown in FIG. 4.

FIG. 5 illustrates signal waveforms appearing in respective nodes of the circuit shown in FIG. 4. With reference to FIG. 5, a signal waveform Vg is transmitted to the gate of the charge transmission transistor 30, and a signal waveform Vgb is generated by the inverter IN 1. The signal waveform Vb has one state at the low voltage Vlow and one state at the high voltage VPP. In the signal waveform Vgb, a low period T2 is shorter than that of the high period, and the signal waveform Vgb is generated in a phase opposite to that of the voltage of the control node Vg. When the signal waveform Vg is maintained at a high level during the period Ti, the charge transmission transistor 30 is turned on, and the period of charge transfer occurs during the time duration Ti that the signal waveform Vg is maintained at the high level, and the period of charge non-transfer occurs during the time duration that the signal waveform Vg is maintained at the low level.

Referring to FIGS. 4 and 5, operations of charge pumping, reducing the body effect, and preventing latch-up will now be described.

Figure 1:
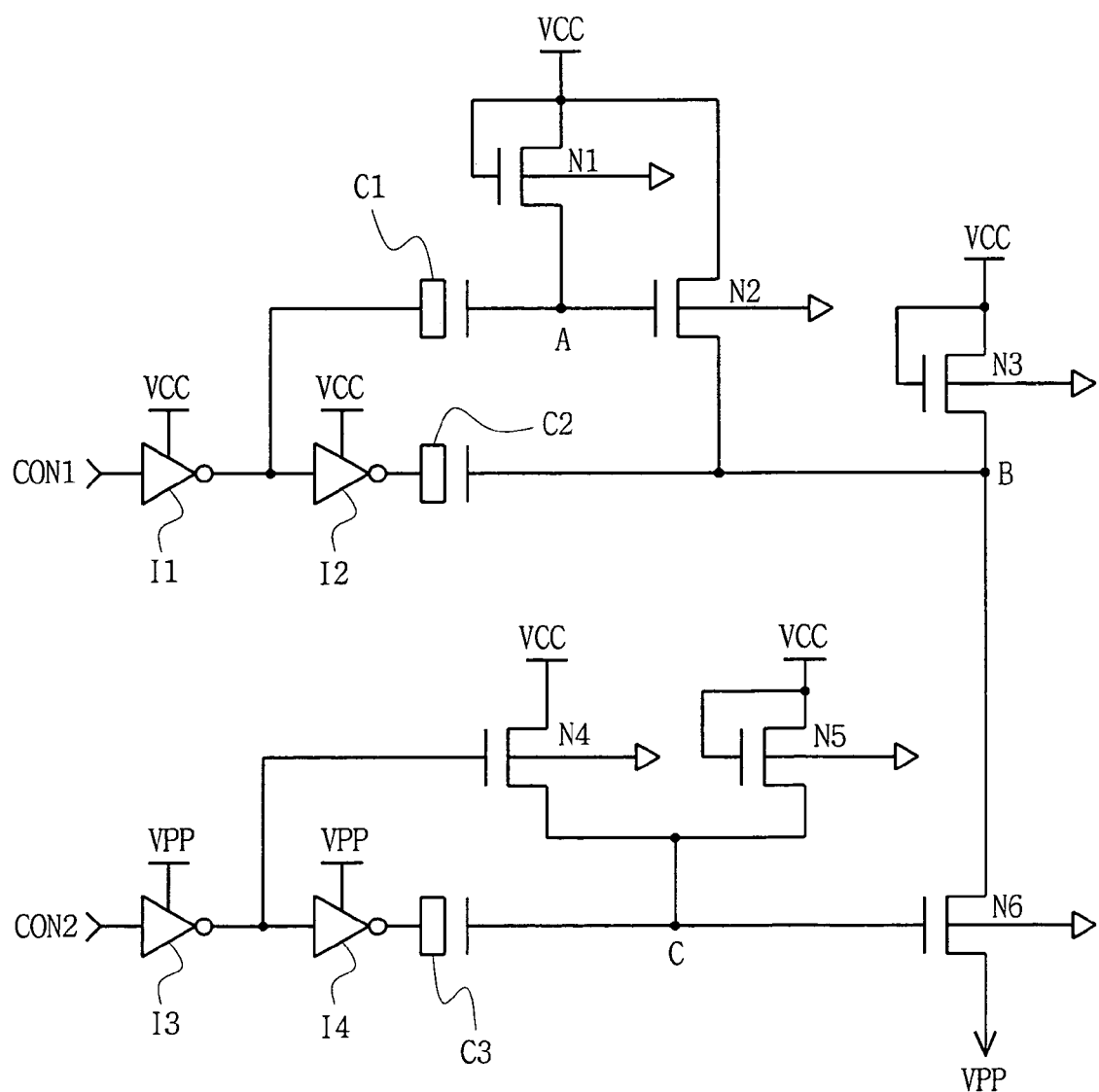
FIG. 1 is a circuit diagram of a charge pump circuit according to the prior art.
Figure 2:
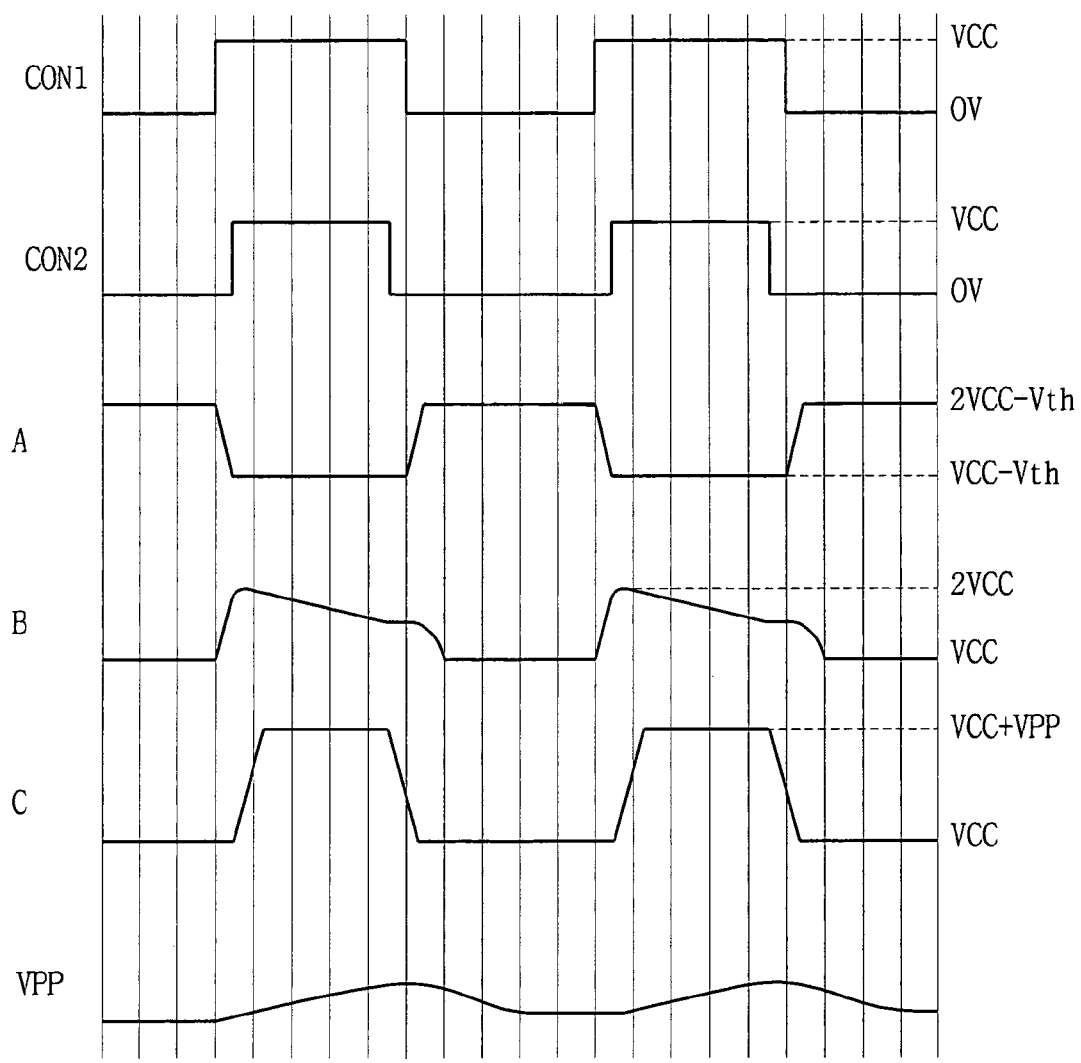
FIG. 2 illustrates signal waveforms appearing in respective nodes of the circuit shown in FIG. 1.
Figure 3:
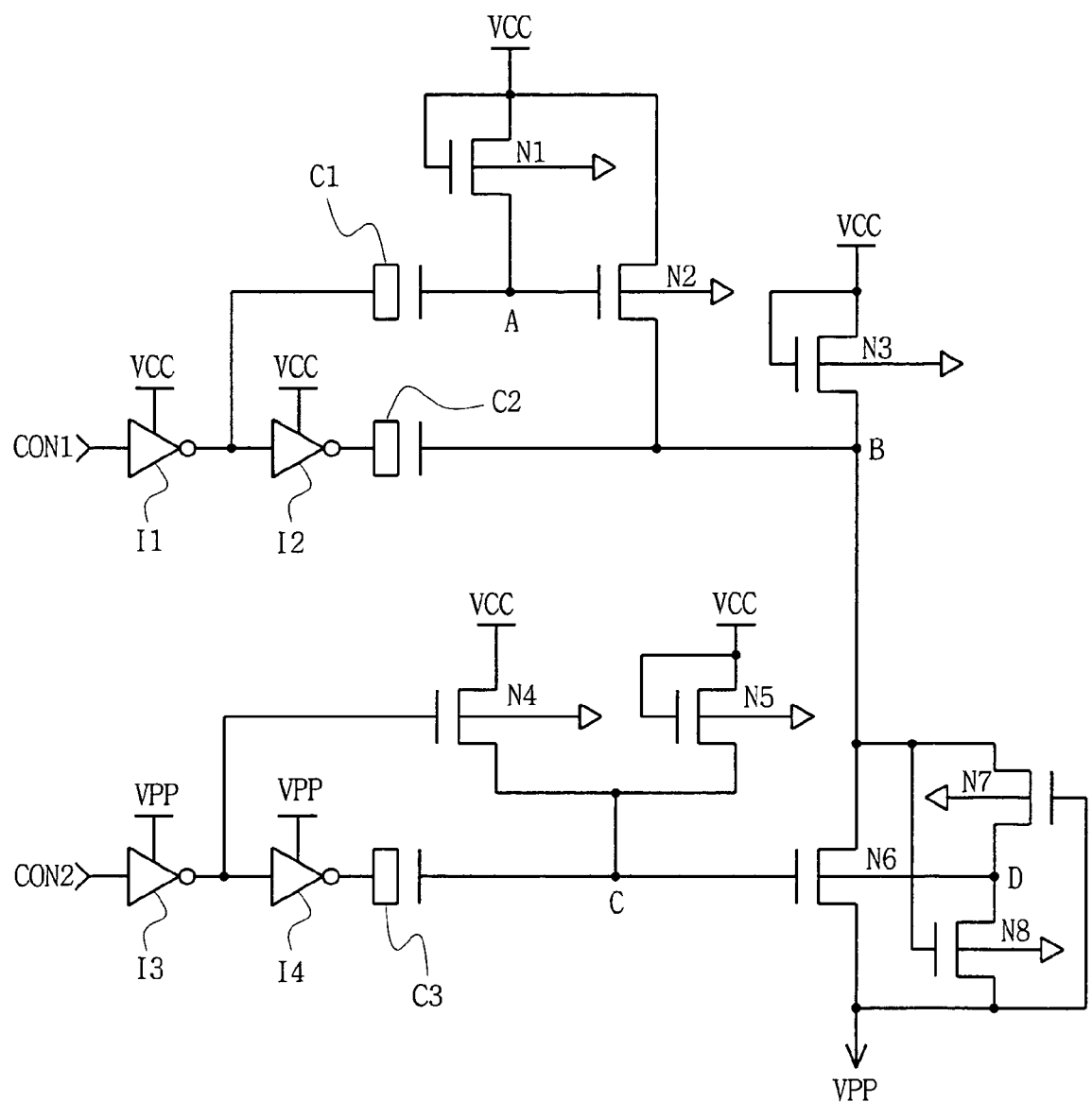
FIG. 3 is a circuit diagram of another charge pump circuit according to the prior art.

When signals CON1 and CON2 are applied at a low or high level, basic operations of the charge pumping portion 50 having the charge transmission transistor 30, for the present embodiment, may be similar to the operations described for of FIGS. 1 and 3. During the time duration of the charge non-transfer period, when the signal waveform Vg shown in FIG. 5 is maintained at the low level, the charge transmission transistor 30 is turned off. At this time, the voltage level of bulk node Vb should be lower than the voltage of the source or drain of the charge transmission transistor 30 to prevent the latch-up generation. The signal waveform Vgb is generated to the high level by the inverting operation of the inverter IN1, and the N-type MOS transistor NT1 of the bulk connection switch 100 is turned on. Thus, the bulk node Vb is maintained at the level of the low voltage shown in signal waveform Vlow of FIG. 5. The low voltage has a level lower than the voltage appearing in the boosting node Vp or the high voltage generation terminal Vo, VPP. Beneficially, the low voltage Vlow can be provided as a ground voltage, e.g., 0V. That is, during the charge non-transfer period, the voltage level of bulk node Vb is lower than the voltage of the source or drain of the charge transmission transistor 30, thus a latch-up generation is prevented.

Operation of the circuit during the charge transfer period will now be described.

During the time duration of the charge transfer period that the signal waveform Vg is maintained at the high level, the charge transmission transistor 30 is turned on. At this time, the voltage level of bulk node Vb should become the voltage level of the high voltage generation terminal VPP to substantially reduce the influence of the body effect. That is, when the bulk (substrate) voltage of the charge transmission transistor 30 increases by an increase of the source voltage, the threshold voltage does not increase. The signal waveform Vgb is generated as a low level during the period T2 by the inverting operation of the inverter IN1, and the P-type MOS transistor PT1 of the bulk connection switch 100 is turned on. Thus, the bulk node Vb is maintained at the level of the high voltage VPP shown in signal waveform Vo of FIG. 5. In other words, during the charge transfer period the voltage of bulk node Vb is maintained as a source voltage of charge transmission transistor 30, and so a body effect is eliminated and there is no threshold voltage increase.

Meanwhile, in the circuit of FIG. 4, the bulk node Vb is always maintained at one level of either the source voltage of the charge transmission transistor 30 or the low voltage Vlow by the switching operation of the bulk connection switch 100, thus the bulk node Vb does not have a floating state. Contrary to the prior art, the circuit of the invention does not have a non-operating period and thus reliability is improved.

Figure 6:
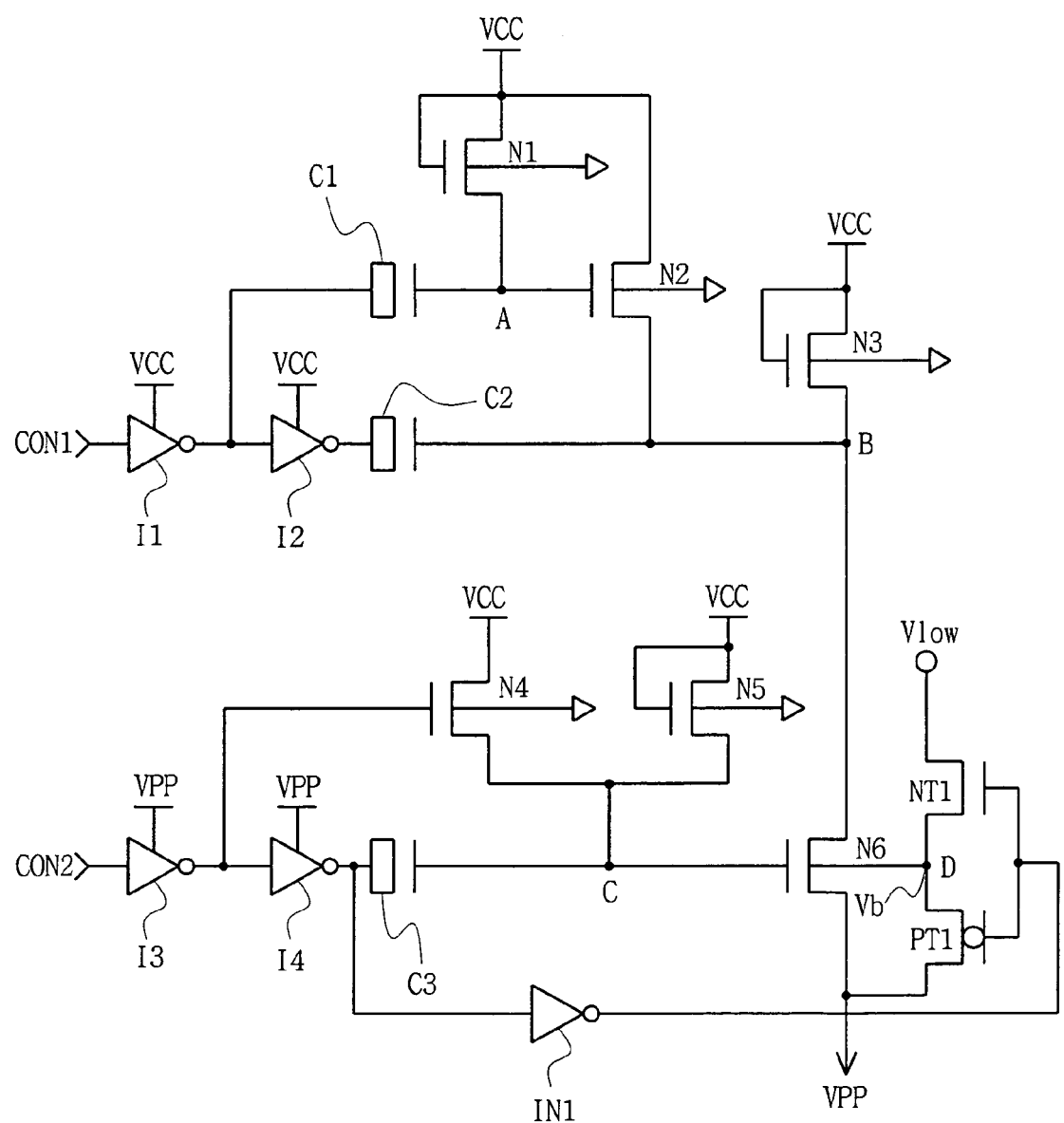
FIG. 6 is a circuit diagram illustrating in detail an example of the charge pump circuit shown in FIG. 4.

FIG. 6 is a circuit diagram illustrating in detail an example of a charge pump circuit shown in FIG. 4, and illustrates a configuration of the circuit that the bulk connection switch 100 may be applied to. Charge pumping and a charge transfer operation in FIG. 6 is basically the same as for FIGS. 1 and 3, but the threshold voltage increase by the body effect is substantially reduced during the charge transfer period, and the latch-up is prevented during the charge non-transfer period. Hence, a considerably improved charge transfer efficiency can be obtained with this charge pump circuit.

A recap of some of the previously described embodiments, as well as other embodiments, will now proceed.

According to an exemplary embodiment of the invention, a high voltage terminal is connected to a bulk (substrate) of a charge transmission transistor to remove a body effect during a pumping operation. Also, during a non-pumping operation period a latch-up generation is prevented, thereby increasing charge transmission efficiency and providing a stabilized operation for the circuit.

As described above, according to an exemplary embodiment of the invention, in a charge pump circuit an increase of threshold voltage of a charge transmission transistor is controlled during a charge transfer period, and during a charge non-transfer period, a latch-up generation is prevented. Accordingly, charge transmission efficiency and reliability of pumping operation are improved, increasing reliability for the data access operation of a semiconductor memory, for example.

Embodiments of the invention may be practiced in many ways. What has been described are exemplary, non-limiting descriptions of some of these embodiments.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, a transistor type of a bulk connection switch may be varied. Accordingly, these and other changes and modifications are seen to be within the true spirit and scope of the invention as defined by the appended claims.

We claim:

1. A charge pump circuit, comprising:
a charge transmission transistor to transmit a voltage of a boosting node to a high voltage generation terminal in response to a control node voltage; and
a bulk connection switch, wherein during a charge transfer period the high voltage generation terminal is connected to a bulk of the charge transmission transistor and during a charge non-transfer period the bulk is connected to a low voltage that is lower than a voltage at the boosting node of the charge transmission transistor or the high voltage generation terminal, such that the bulk does not have a floating state.

2. The circuit of claim 1, wherein the low voltage is a ground voltage.

3. The circuit of claim 1, wherein the charge transmission transistor is an N-type MOS (Metal Oxide semiconductor) transistor.

4. The circuit of claim 1, wherein the bulk connection switch connects the bulk to the high voltage generation terminal during the charge transfer period and connects the bulk to the low voltage during the charge non-transfer period in response to a pulse signal.

5. A charge pump circuit, comprising:
a charge transmission transistor to transmit a voltage of a boosting node to a high voltage generation terminal in response to a control node voltage; and
a bulk connection switch, wherein during a charge transfer period the high voltage generation terminal is connected to a bulk of the charge transmission transistor and during a charge non-transfer period the bulk is connected to a low voltage that is lower than a voltage at the boosting node of the charge transmission transistor or the high voltage generation terminal;
wherein the charge transmission transistor is an N-type MOS (Metal Oxide semiconductor) transistor; and
wherein the bulk connection switch comprises:
an inverter to generate a gate input voltage having a low-voltage period that is shorter than a high-voltage period and which has a phase opposite to that of the control node voltage;
a first MOS transistor having its gate connected to the gate input voltage, its source connected to the low voltage, and its drain connected to the bulk; and
a second MOS transistor having its gate connected to the gate input voltage, its drain connected to the bulk, and its source connected to the high voltage generation terminal.

6. The circuit of claim 5, wherein the first MOS transistor is an N-type MOS transistor.

7. The circuit of claim 6, wherein the second MOS transistor is a P-type MOS transistor.

8. A charge pump circuit for use in a semiconductor memory device, the circuit comprising:
a charge pumping portion to provide a voltage to a control node and a boosting node in response to first and second pulse signals having the same phase;
a charge transmission transistor to transmit a voltage of the boosting node to a high voltage generation terminal in response to the control node voltage; and
a bulk connection switch, wherein during a charge transfer period the high voltage generation terminal is connected to a substrate of the charge transmission transistor and during a charge non-transfer period the substrate is connected to a ground voltage.

9. The circuit of claim 8, wherein the charge transmission transistor is a N-type MOS transistor.

10. The circuit of claim 9, wherein the bulk connection switch comprises:
an inverter to generate a gate input voltage having a low-voltage period that is shorter than a high-voltage period and which has a phase opposite to that of the voltage of the control node;
a first MOS transistor having its gate connected to the gate input voltage, its source connected to the low voltage, and its drain connected to the bulk; and
a second MOS transistor having its gate connected to the gate input voltage, its drain connected to the bulk, and its source connected to the high voltage generation terminal.

11. The circuit of claim 10, wherein the first MOS transistor is an N-type MOS transistor.

12. The circuit of claim 11, wherein the second MOS transistor is a P-type MOS transistor.

13. A method of charge pumping for a memory device, comprising:
transmitting, through a charge transmission transistor, a boosting node voltage to a high voltage generation terminal in response to a control signal;
controlling a bulk of the charge transmission transistor in response to the control signal;
connecting the high voltage generation terminal to the bulk of the charge transmission transistor during a charge transfer period; and
connecting a low voltage to the bulk of the charge transmission transistor during a charge non-transfer period, wherein the low voltage is lower than the boosting node voltage or the high voltage generation terminal.

14. The method of claim 13, further comprising:
generating a gate input voltage having a low-voltage period that is shorter than a high-voltage period and having a phase opposite to that of the control signal, wherein
a first transistor has its gate connected to the gate input voltage, its source connected to the low voltage, and its drain connected to the bulk, and;
a second transistor has its gate connected to the gate input voltage, its source connected to the high voltage generation terminal, and its drain connected to the bulk.

15. The method of claim 14, wherein the first and the second transistors are MOS transistors.

16. The method of claim 14, wherein the charge pumping occurs inside a semiconductor memory chip.

17. The method of claim 16, further comprising accessing memory data.

18. A method of charge pumping for a memory device, comprising:
transmitting, through a charge transmission transistor, a boosting node voltage to a high voltage generation terminal in response to a control signal; and
controlling a bulk of the charge transmission transistor in response to the control signal;
wherein the charge pumping occurs inside a memory chip.

19. The method of claim 18, further comprising accessing memory data.

* * * * *

UNITED STATES PATENT AND TRADEMARK OFFICE
CERTIFICATE OF CORRECTION

PATENT NO. : 7,333,373 B2  Page 1 of 1
APPLICATION NO. : 11/210460
DATED : February 19, 2008
INVENTOR(S) : Hyung-Sik You et al.

It is certified that error appears in the above-identified patent and that said Letters Patent is hereby corrected as shown below:

Column 1, line 40, the words "inverter 13" should read -- inverter I3 --;
Column 4, line 32, the words "period Ti" should read -- period T1 --;
Column 4, line 34, the words "duration Ti" should read -- duration T1 --.

Signed and Sealed this

Twenty-sixth Day of August, 2008

JON W. DUDAS
*Director of the United States Patent and Trademark Office*